(12) United States Patent
Tang et al.

(10) Patent No.: US 9,143,166 B1
(45) Date of Patent: Sep. 22, 2015

(54) ADAPTIVE SCHEDULING OF TURBO EQUALIZATION BASED ON A METRIC

(75) Inventors: Xiangyu Tang, San Jose, CA (US); Yu Kou, San Jose, CA (US); Lingqi Zeng, Turlock, CA (US)

(73) Assignee: SK hynix memory solutions inc., San Jose, CA (US)

( * ) Notice: Subject to any disclaimer, the term of this patent is extended or adjusted under 35 U.S.C. 154(b) by 182 days.

(21) Appl. No.: 13/405,331

(22) Filed: Feb. 26, 2012

Related U.S. Application Data (60) Provisional application No. 61/466,789, filed on Mar. 23, 2011.

(51) Int. Cl.
*H03M 13/00* (2006.01)
*H03M 13/09* (2006.01)

(52) U.S. Cl.
CPC ..................................... *H03M 13/09* (2013.01)

(58) Field of Classification Search
CPC ............ H03M 13/05; H03M 13/1128; H03M 13/114; H03M 13/1142; H03M 13/2957; H03M 13/6331; H03M 13/116; G06F 11/10; H04L 1/0057; H04L 1/005
USPC .......................................................... 714/758
See application file for complete search history.

(56) References Cited

U.S. PATENT DOCUMENTS

| | | | |
|---|---|---|---|
| 6,115,828 A | 9/2000 | Tsutsumi et al. | |
| 6,927,707 B2 | 8/2005 | Nguyen et al. | |
| 7,237,181 B2 | 6/2007 | Richardson | |
| 7,266,757 B1 | 9/2007 | Mazahreh et al. | |
| 7,310,768 B2 | 12/2007 | Eidson et al. | |
| 7,730,377 B2 | 6/2010 | Hocevar | |
| 7,958,427 B1 | 6/2011 | Yeung et al. | |
| 8,219,878 B1 | 7/2012 | Varnica et al. | |
| 8,234,549 B2 * | 7/2012 | Djordjevic et al. | 714/780 |
| 8,312,354 B1 | 11/2012 | Varnica et al. | |
| 8,484,531 B1 | 7/2013 | Varnica et al. | |
| 8,601,338 B2 | 12/2013 | Kolze | |
| 8,671,325 B1 | 3/2014 | Feng | |
| 2002/0124227 A1 | 9/2002 | Nguyen | |
| 2005/0273687 A1 | 12/2005 | Park et al. | |
| 2007/0089019 A1 * | 4/2007 | Tang et al. | 714/752 |
| 2007/0168832 A1 * | 7/2007 | Richardson et al. | 714/758 |
| 2008/0276156 A1 | 11/2008 | Gunnam et al. | |
| 2008/0301521 A1 | 12/2008 | Gunnam et al. | |
| 2009/0074112 A1 * | 3/2009 | Coersmeier et al. | 375/340 |
| 2009/0094503 A1 * | 4/2009 | Shin et al. | 714/755 |
| 2009/0150746 A1 * | 6/2009 | Chaichanavong et al. | 714/752 |

(Continued)

OTHER PUBLICATIONS

Author: Akl Charaf, Pierre Pénard and Laurent Cariou, Georges Rodriguez-Guisantes; Title: Study of stopping criteria in LDPC coded iterative MIMO OFDM receiver; Publisher: IEEE, 2011; 978-1-4577-2014-7/11.*

(Continued)

*Primary Examiner* — April Y Blair
*Assistant Examiner* — Thien D Nguyen
(74) *Attorney, Agent, or Firm* — Van Pelt, Yi & James LLP (57) ABSTRACT

Turbo equalization is performing by using a soft output detector to perform decoding. At least a portion of a local iteration of decoding is performed using a soft output decoder. A metric associated with decoding progress is generated and it is determined whether to perform another local iteration of decoding based at least in part on the metric.

23 Claims, 8 Drawing Sheets

(56) References Cited

U.S. PATENT DOCUMENTS

2010/0174959 A1* 7/2010 No et al. .......... 714/746
2011/0087946 A1* 4/2011 Planjery et al. .......... 714/752
2011/0320902 A1* 12/2011 Gunnam .......... 714/752

OTHER PUBLICATIONS

Hagenauer et al., A Viterbi algorithm with soft-decision outputs and its applications., Proc. IEEE Global Telecommunications Conference Nov. 1989, pp. 1680-1686.

Koetter et al., Turbo Equalization an iterative equalization and decoding technique for coded data transmission., IEEE Signal Processing Magazine Jan. 2004, pp. 67-80.

Lee et al., Scheduling for an adaptive number of iterations in turbo equalizers combined with LDPC Decoders., IEEE Transactions on Communications, Oct. 2010, pp. 2759-2764 vol. 58, No. 10.

Zhao et al., A Ber performance-aware early termination scheme for layered LDPC Decoder., IEEE 2010, pp. 416-419.

Amador et al., Hybrid iteration control on LDPC Decoders., Sep. 2010.

* cited by examiner

ADAPTIVE SCHEDULING OF TURBO EQUALIZATION BASED ON A METRIC

CROSS REFERENCE TO OTHER APPLICATIONS

This application claims priority to U.S. Provisional Patent Application No. 61/466,789 entitled LDPC DECODING CONVERGENCE SPEED THROUGH ADAPTIVE SCHEDULING OF TURBO-EQUALIZATION filed Mar. 23, 2011 which is incorporated herein by reference for all purposes.

BACKGROUND OF THE INVENTION

Turbo equalization is a decoding process in which two processors take turns operating on encoded information. For example, a soft output Viterbi detector may operate on the encoded data first and then a low-density parity-check (LDPC) decoder takes over using information generated by the soft output Viterbi detector. In some cases, the LDPC decoder may perform multiple (e.g., back to back) attempts before the soft output Viterbi detector takes over again, if needed. In turbo decoding, decoding ends after the second processor (e.g., a soft output Viterbi detector) has completed, not after the first processor has completed (e.g., a LDPC decoder) so that if the soft output Viterbi detector took over again, the LDPC decoder would also be used at least one more time.

It would be desirable if the overall time to convergence (e.g., related to the number of soft output Viterbi detector attempts and number of LDPC decoder attempts required to properly decode the data) could be reduced. For example, if the number of local (e.g., back to back or successive) iterations of the LDPC decoder is fixed, termination of the LDPC decoder may end too late or too early. As an example of too many local iterations of the LDPC decoder when a fixed number of local iterations is used, the noise characteristics may be such that a pass by the soft output Viterbi detector would be better than further attempts by the LDPC decoder; however, if the LDPC decoder is only on its $2^{nd}$ of 10 local iterations (as an example), then the system will unnecessarily continue with LDPC decoding when it should move on to the soft output Viterbi detector. As an example of too few local iterations of LDPC decoding, suppose the LDPC decoder is on its $10^{th}$ of 10 attempts. With a fixed number of local iterations, the system will switch to the soft output Viterbi detector after the $10^{th}$ local iteration, but there may be only a little bit of noise and an $11^{th}$ local iteration by the LDPC decoder will complete the decoding process. As described above, decoding ends after the LDPC decoder completes (not the soft output Viterbi detector) so even after the soft output Viterbi detector runs at least one more local iteration of the LDPC decoder would be performed. Since one iteration by a soft output Viterbi detector could take multiple times the processing time of one (local) iteration of a LDPC decoder, this would add noticeable and unnecessary delay. Put generally, a fixed number of local LDPC decoder iterations does not take into account individual differences due to the uniqueness of each codeword and/or the unique characteristics of noise affecting it.

New metrics for adaptive scheduling in turbo equalization are desirable. Preferably, such a metric is relatively easy to obtain or otherwise compute. For example, metrics which are mathematically intensive are unattractive because computation consumes significant processing resources and/or power.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
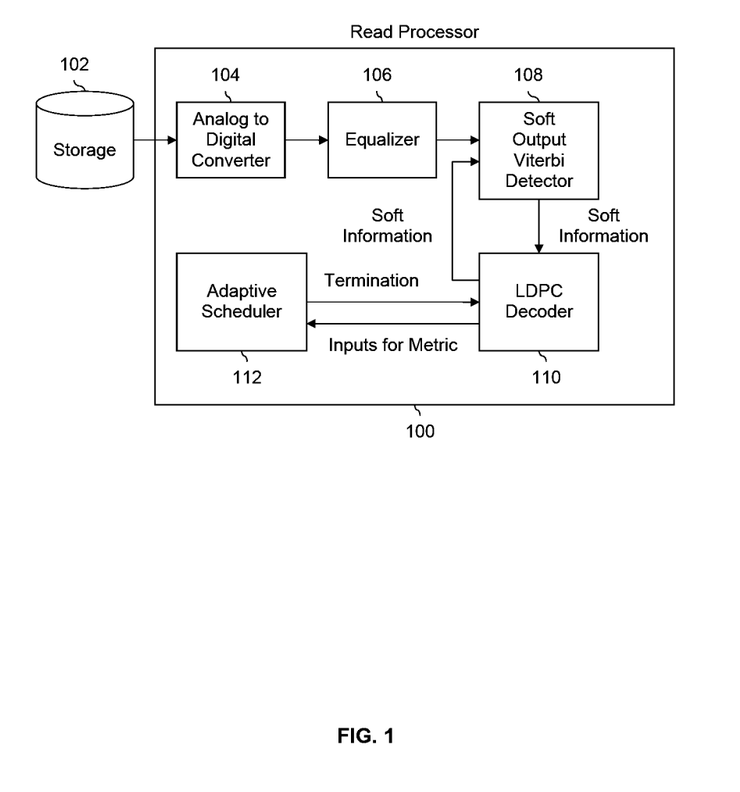
FIG. 1 is a block diagram showing an embodiment of a system configured to perform adaptive scheduling during turbo equalization.

FIG. 1 is a block diagram showing an embodiment of a system configured to perform adaptive scheduling during turbo equalization. In the example shown, adaptive scheduler 112 determines when to stop local (e.g., back to back) iterations of low-density parity-check (LDPC) decoder 110 based at least upon on a metric associated with the progress of LDPC decoder 110. For clarity, read-related processes and components are shown in this figure and other figures; components or processes associated with writing may not necessarily be shown in this figure or other figures.

In this example, read processor 100 reads data stored in storage 102. In various embodiments, storage 102 includes magnetic disk storage or Flash storage. An analog signal is passed from storage 102 to analog to digital converter 104 which outputs digital samples. The digital samples are passed to equalizer 106. In some embodiments, an equalizer removes the effects of inter-symbol interference (ISI), for example from an adjacent track.

The equalized samples are passed from equalizer 106 to soft output Viterbi detector 108, which in turn further mitigates ISI and generates an estimate in the form of reliability or (more generally) soft information. The soft information is passed to low-density parity-check (LDPC) decoder 110. As used herein, a global iteration refers to one complete cycle of turbo equalization (that is, one pass by the soft output Viterbi detector and however many local iterations by the LDPC decoder are determined to be appropriate by the adaptive scheduler). In turbo equalization, two processors (e.g., soft output Viterbi detector 108 and LDPC decoder 110) take turns decoding data.

Conceptually, LDPC decoder 110 performs decoding using a form of belief propagation where soft information is passed as messages via a graph which describes or otherwise represents the particular LDPC code used. For data with relatively little noise or errors, one iteration by soft output Viterbi detector 108 followed by one iteration of LDPC decoder 110 is sufficient to properly decode data stored in storage 102. If needed, LDPC decoder 110 performs several local iterations (e.g., back to back iterations without the soft output Viterbi detector taking over) where each local iteration generates soft information that is used in the next local iteration.

While the data is still uncorrected, the number of local (e.g., back to back) iterations by LDPC decoder 110 is controlled by adaptive scheduler 112. Adaptive scheduler 112 takes inputs for a metric from LDPC decoder 110 and generates a metric associated with the progress of LDPC decoder 110. When, based at least in part on the metric, adaptive scheduler 112 determines that it is better for soft output Viterbi detector 108 to take over for LDPC decoder 110, a termination signal is sent to LDPC decoder 110. In some embodiments, the inputs used to generate a metric are related to interconnected check nodes and parity nodes which describe the message passing and updating of a particular LDPC code. Metric generation, including example inputs used to generate a metric, is described in further detail below.

If LDPC decoder 110 has not completely finished decoding and the termination signal is sent to LDPC decoder 100 then soft output Viterbi detector 108 takes over again. If so, soft information generated by LDPC decoder 110 (e.g., at the last local iteration before the soft output Viterbi detector takes over) is passed to soft output Viterbi detector 108 which uses the independently generated soft information to conduct another round of equalization. This looping or ping-ponging between the soft output Viterbi detector and LDPC decoder (i.e., turbo equalization) and can be conducted multiple times if needed (i.e., so long as decoding is still unsuccessful). Put another away, two or more global iterations may be performed.

Although this figure shows an exemplary storage application, the techniques described herein are not limited to storage embodiments and are applicable to a wide range of applications. For example, wireless or wire-line communications may exchange encoded data and the techniques described herein may be used in a communications system (e.g., in a receiver configured to decode a received signal). Another example application is the encoding and transfer of video (e.g., live video such as video conferencing or previously recorded information such as a television show or movie).

Similarly, the soft output Viterbi detector and LDPC decoder shown in this figure are merely exemplary. Other detectors and decoders may be used and the examples described herein may be modified accordingly. For example, although this and other examples may describe only one pass by the soft output Viterbi detector before the LDPC decoder takes over, some other processors may perform multiple back to back iterations before the second processor takes over.

Figure 2:
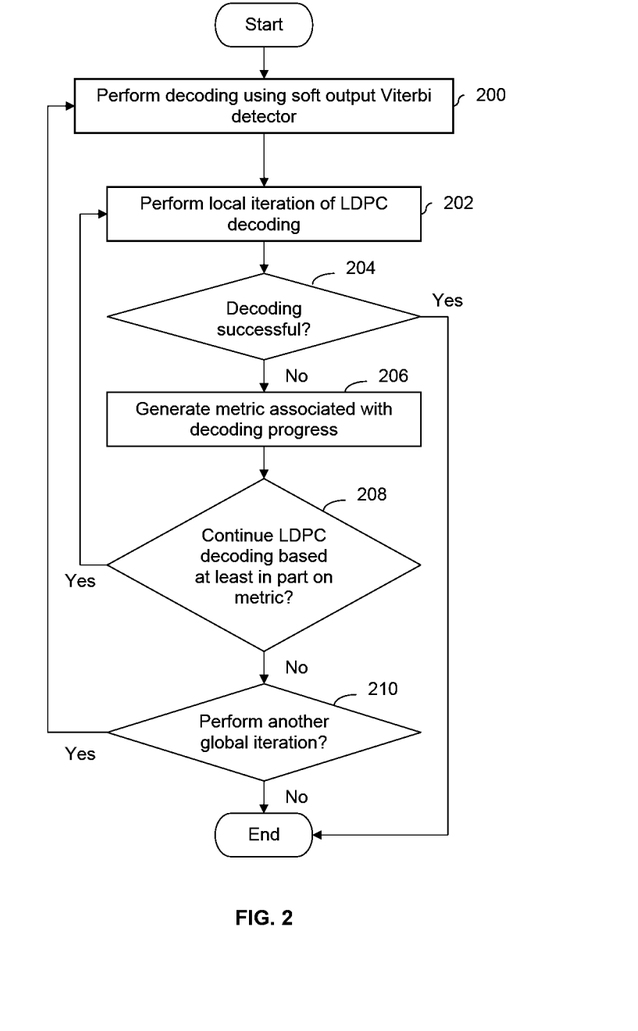
FIG. 2 is a flowchart illustrating an embodiment of a process for performing turbo equalization using a LDPC decoder with adaptive scheduling.

FIG. 2 is a flowchart illustrating an embodiment of a process for performing turbo equalization using a LDPC decoder with adaptive scheduling. In the example shown, the process corresponds to the example system shown in FIG. 1; some other system embodiments may have different corresponding processes than the example shown herein.

At 200, decoding is performed using a soft output Viterbi detector. For example, in FIG. 1, soft output Viterbi detector 108 attempts to decode the equalized data from equalizer 106. At 202, a local iteration of LDPC decoding is performed. In FIG. 1, for example, LDPC decoder 110 operates on the soft information passed to it by soft output Viterbi detector 108.

It is determined at 204 whether decoded is successful. For data with relatively little noise or errors, for example, a single pass of a soft output Viterbi detector followed by a single local iteration of a LDPC decoder is sufficient. If it is determined at 204 that decoding is successful then the process ends (or alternatively restarts with a next piece of encoded data).

If decoding is not successful, a metric associated with the progress of LDPC decoding is generated at 206. For example, adaptive scheduler 112 in FIG. 1 generates a metric using input(s) from LDPC decoder 110. In some embodiments, the metric is based on some value, characteristic or property associated with messages exchanged during LDPC decoding. Graphically, a given (n, k) LDPC code can be represented as n variable nodes and (n–k) check nodes with various interconnections between the two sets of nodes. Messages are passed between the two sets of nodes via the interconnections and the encoded data is properly decoded when parity checks associated with the (n-k) check nodes are satisfied. In some embodiments, a metric is based at least in part on a number of unsatisfied parity checks (e.g., a number of unsatisfied parity checks or a change in the number of unsatisfied parity checks). In some embodiments, a metric is based at least in part on a magnitude of a message. In some embodiments, a metric is based at least in part on a number of sign flips in a message (e.g., from positive to negative or vice versa).

At 208, it is determined whether to continue LDPC decoding based at least in part on a metric. For example, if LDPC decoding has made good progress in one or more recent local iterations (e.g., as represented or estimated by the metric), then it is determined to continue decoding. If so, another local iteration of LDPC decoding is performed at 202. Otherwise, it is determined at 210 whether to perform another global iteration. For example, there may be a minimum and/or maximum number of global iterations and the number of global iterations already performed may be compared to such a minimum and/or maximum. If it is determined to perform another global iteration at 210, decoding using a soft output Viterbi detector is performed at 200. For example, soft output Viterbi detector 108 in FIG. 1 may use the soft information from LDPC decoder 110 in this decoding attempt.

Figure 3:
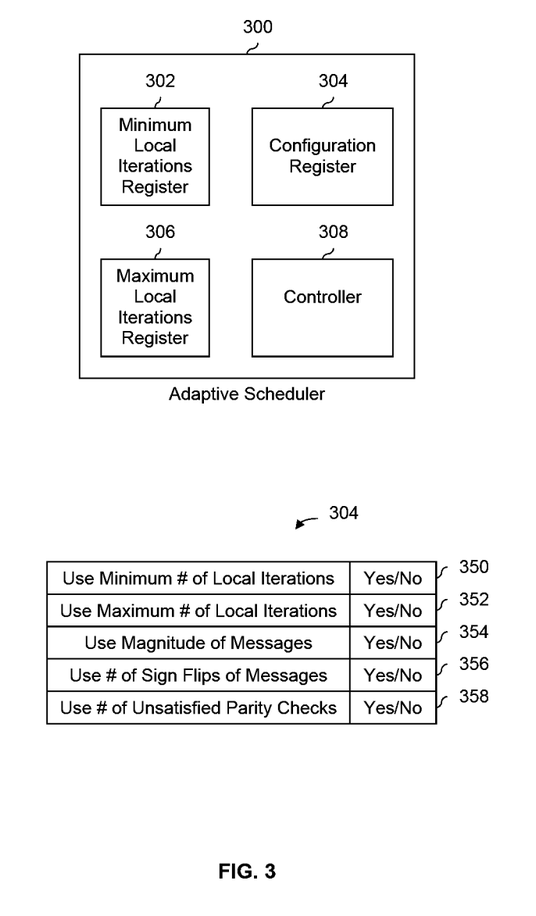
FIG. 3 is a diagram showing an embodiment of an adaptive scheduler.

FIG. 3 is a diagram showing an embodiment of an adaptive scheduler. In some embodiments, adaptive scheduler 112 in FIG. 1 is implemented as shown. In the example shown, adaptive scheduler 300 determines (e.g., adaptively, based on current and/or recent conditions, etc.) when to terminate local iterations of a processor used in turbo equalization (e.g., an LDPC decoder). Configuration register 304 is used to configure adaptive scheduler, for example to use a particular set of logic in deciding whether or not to terminate local iterations of an LDPC decoder. In the example shown, configuration register 304 can be set so that adaptive scheduler 300 uses a minimum number of iterations (350) and/or a maximum number of iterations (352), if desired. The actual number of minimum local iterations and maximum local iterations are obtained from registers 302 and 306, respectively, and are configurable. Returning back to the example of FIG. 2, if so configured, a minimum number of local iterations and/or a maximum number of local iterations is used at 208 to determine whether to continue LDPC decoding. For example, during the first local iteration of the first global iteration, a metric may not be that reliable and so a minimum number of local iterations may be desirable; a maximum number of local iterations may prevent an infinite loop from occurring.

Other options included in configuration register 304 include using the magnitude of messages (354), using the number of sign flips in messages (356) such as from positive to negative or vice versa as they are exchanged between check nodes and variable nodes, and using the number of unsatisfied parity checks (358). In some embodiments, a change in a sum of magnitudes of messages is used as an indicator of the progress of an LDPC decoder. If the sum is steadily increasing, then the LDPC decoder is making good progress. If the sum remains relatively constant, or is increasing relatively slowly, then the LDPC decoder is not making progress. The sum of the magnitude may seen as the confidence the decoder has in its decisions. If the confidence is increasing, then progress is being made, if confidence is stagnant, then the decoder is at a loss for what to do. Similarly, a change in the total number of sign flips is used as an indicator for LDPC decoding progress in some embodiments. If the total number of sign flips is steadily decreasing, then LDPC decoder is making progress. If the total remains somewhat constant, then LDPC decoder is stuck and cannot make up its mind.

In general, a metric is associated with or estimates the progress of LDPC decoding, for example on a relative scale (e.g., the last local iteration eliminated a large number of errors) and/or an absolute scale (e.g., LDPC decoder is very close to completing decoding). Depending upon the particular implementation or design of a read processor, the metric may be calculated in a variety of ways. In various embodiments, various inputs are used to generate a metric; the example inputs shown herein are merely exemplary and are not intended to be limiting.

Figure 4:
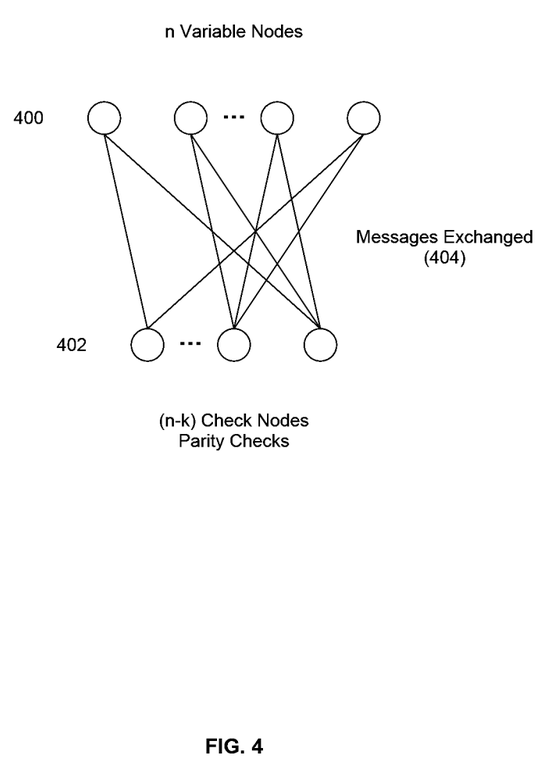
FIG. 4 is a diagram illustrating an embodiment of variable nodes and check nodes associated with an LDPC code.

FIG. 4 is a diagram illustrating an embodiment of variable nodes and check nodes associated with an LDPC code. In the example shown, a given (n, k) LDPC code is represented as n variable nodes (400) and (n-k) check nodes (402) with various interconnections between the two sets of nodes which describe the particular LDPC code. Messages (404) are exchanged between variable nodes 400 and check nodes 402 via the interconnections. In some embodiments, information associated with the check nodes (402) and/or the related parity checks is used to generate a metric used in adaptive scheduling. In some embodiments, information associated with the messages is used to generate such a metric.

Using information associated with messages 404 and/or the parity checks associated with check nodes (402) in generating a metric may be desirable a variety of reasons. For example, the information may be readily available and/or require little or no processing to obtain. Some or all of this information may be calculated or obtained as part of a normal or regular decoding process, so it may already be available and/or require no additional logic to calculate. Some other adaptive scheduling techniques use an approximation of extrinsic information, which requires a relatively precise model of the communication channel and a series of pre-programmed thresholds for each channel condition. The former is often not available and the latter is mathematically complicated, often requiring significant processing resources, making that technique unattractive. Another advantage is that successful LDPC decoding may be closely related to the exchanged messages and/or the parity checks, and thus a metric generated with such information may be a good estimation of the progress of LDPC decoding. In stepped decoding where a decoding iteration is divided into multiple steps and after each step, the number of unsatisfied parity checks is determined and decoding is successful when all of the parity checks are satisfied. The messages and parity checks are therefore closely related to the progress of LDPC decoding.

The following figures describe some embodiments of metrics which are based at least in part on unsatisfied parity checks. In some other embodiments, some other information is used to generate a metric.

Figure 5:
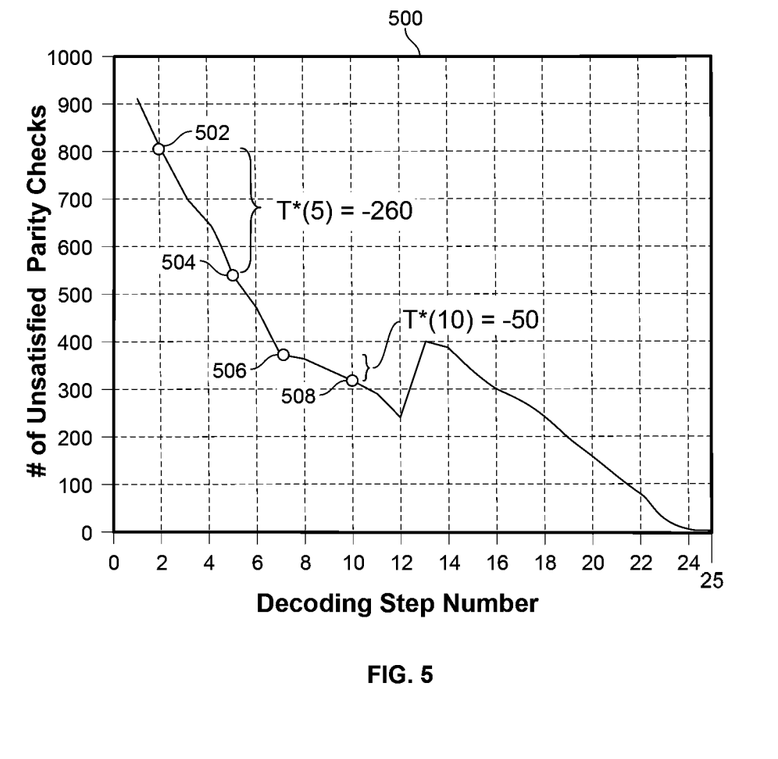
FIG. 5 is a graph showing an embodiment of a metric based on a difference between a number of unsatisfied parity checks for a first step and a number of unsatisfied parity checks for a second step.

FIG. 5 is a graph showing an embodiment of a metric based on a difference between a number of unsatisfied parity checks for a first step and a number of unsatisfied parity checks for a second step. In the example shown, a metric is calculated using the equation:

$$T^*(k)=\Sigma_{t=max(0,k-w+1)}^{k}u_t-\Sigma_{t=max(0,k-w)}^{k-1}u_t \quad (1)$$

where $T^*$ is the metric, k is a current step for which the metric is being calculated, w is a window size (in steps), and $u_t$ is a number of unsatisfied parity checks at step t. Some of the terms in the first and second summations cancel each other out, and therefore Equation (1) can be rewritten as:

$$T^*(k)=u_k-u_{k-w} \text{ for } k-w \geq 0 \quad (2)$$

In graph 500, calculated metric values are shown for two values of k where w (i.e., the window size) equals 3. The metric for the 5$^{th}$ step (i.e., T*(5)) is the difference between the number of unsatisfied parity checks at the 5$^{th}$ step (504) minus the number of unsatisfied parity checks at the 2$^{nd}$ step (502). As shown in this example, T*(5)=−260. Similarly, the metric for the 10$^{th}$ step is the number of unsatisfied parity checks at the 10$^{th}$ step (508) minus the number of unsatisfied parity checks at the 7$^{th}$ step (506); T*(10)=−50.

Conceptually, what the graph shows is that more improvement is made between step 502 and step 504 than between step 506 and step 508; this is reflected in the respective magnitudes of T*(5) and T*(10). Note, for example, that the LDPC decoder was able to decrease the number of unsatisfied parity checks between steps 502 and 504 by 260, whereas the number of unsatisfied parity checks decreased by only 50 between steps 506 and 508. In some embodiments, so long as a certain amount of progress has been made in recent steps of LDPC decoding (i.e., represented by the magnitude of the metric in Equation (2)), the LDPC decoder is permitted to continue performing local iterations. For example:

for $k-w \geq 0$: if $|u_k - u_{k-w}| > T$, then continue LDPC decoding, otherwise, stop LDPC decoding. (3)

Put another way, an LDPC decoder may be making relatively good progress and increasing the number of parity checks that are satisfied, but if the LDPC decoder is making less progress, then an adaptive scheduler may decide to terminate the LDPC decoder (e.g., and return to the soft output Viterbi detector at the next "graceful" opportunity).

Figure 6:
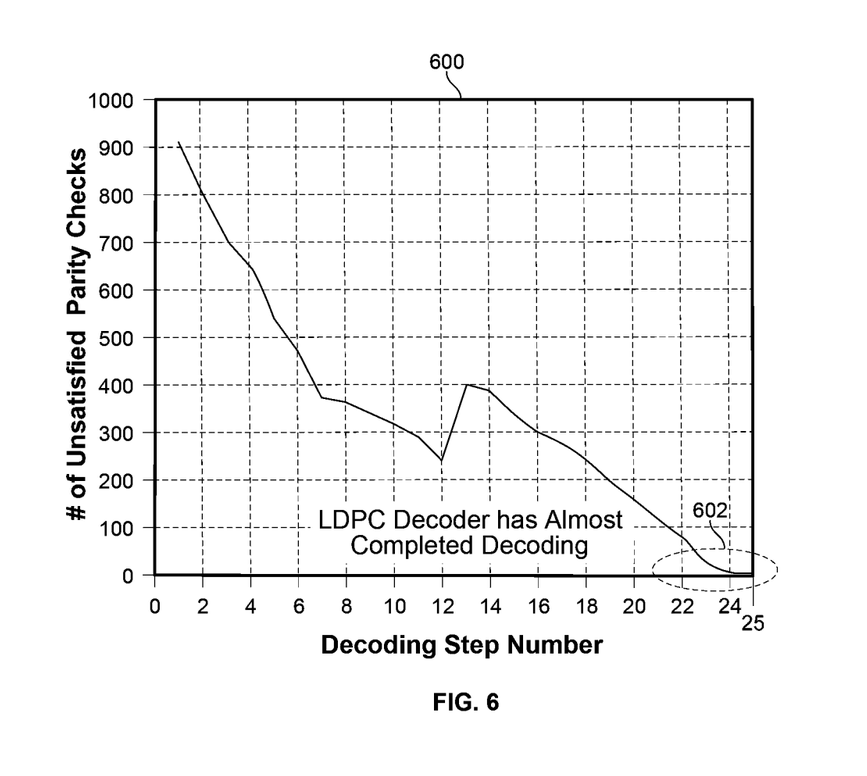
FIG. 6 is a graph showing an embodiment of a metric based on a number of unsatisfied parity checks in order to sense when successful completion of decoding is close.

FIG. 6 is a graph showing an embodiment of a metric based on a number of unsatisfied parity checks in order to sense when successful completion of decoding is close. In the example shown, ending portion 602 of graph 600 shows that at the end of decoding, the number of unsatisfied parity checks is quite small (e.g., 50 unsatisfied parity checks or less). In some embodiments a metric is calculate according to the equation:

$$T^*(k) = u_t \quad (4)$$

where T* is the metric and $u_t$ is the number of unsatisfied parity checks at step k and:

if $u_k < T$, then continue LDPC decoding(e.g., overriding other adaptive scheduling logic if so configured), otherwise, use some other adaptive scheduling logic to determine whether to continue/stop LDPC decoding. (5)

The example metric and logic described in Equations (4) and (5) force the LDPC decoder to continue decoding when successful completion of decoding is relatively close, even if some other indicators or logic would otherwise indicate that a soft output Viterbi should take over. One pass by a soft output Viterbi detector make take longer than a single local iteration of a LDPC decoder, so switching to a soft output Viterbi detector when the LDPC decoder is so close to complete adds unnecessary and noticeable delay to the decoding process.

Figure 7:
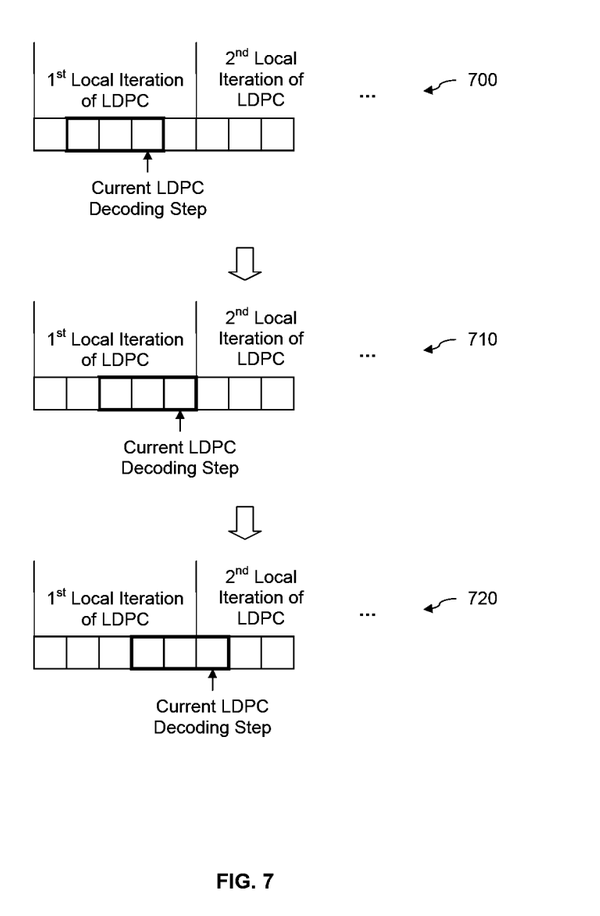
FIG. 7 is a diagram showing an embodiment of a moving average.

In stepped decoding, values (such as a number of unsatisfied parity checks, the sign and/or magnitude of a message, etc.) may fluctuate from step to step. In some embodiments, to smooth out or filter out such "noise," a moving average is used. The following figure shows one embodiment of a moving average.

FIG. 7 is a diagram showing an embodiment of a moving average. In some embodiments, a moving average is applied to a message, parity check or other value associated with LDPC decoding. In the example shown, the window size associated with the moving average is 3 steps and there are 5 steps in each local iteration. At 700, the moving average encompasses values related to the $2^{nd}$, $3^{rd}$, and $4^{th}$ steps and an average is taken of the values for those 3 steps. At 710, the window includes the $3^{rd}$, $4^{th}$, and $5^{th}$ steps and values for those steps are averaged; at 720, the window includes the $4^{th}$, $5^{th}$, and $6^{th}$ steps and values for those steps are averaged.

In this example, a window associated with a moving average is able to move across local iteration boundaries as is shown at 720. At 720, the $4^{th}$ and $5^{th}$ steps are part of the $1^{st}$ iteration and the $6^{th}$ step is part of the $2^{nd}$ iteration, but all of the values associated with those steps are treated the same, regardless of which local iteration the value is associated with.

In some embodiments, a difference of moving averages is used to measure improvement or progress, for example similar to the embodiment described in FIG. 5. For example, instead of taking the difference between two instantaneous or single values as is shown in FIG. 5, in some embodiments, an amount of improvement is measured by taking the difference between two moving averages.

Similarly, a moving average may be combined with the embodiment shown in FIG. 6. A moving average may prevent LDPC decoding from ending prematurely due to a relatively small increase in the number of unsatisfied parity checks. For example, if a sequence of unsatisfied parity checks is (49, 47, 51, 42), and the threshold is 50, then without a moving average, the instantaneous value of 51 may cause the LDPC decoder to terminate prematurely, whereas a moving average may prevent this from occurring.

In some embodiments, instead of using a moving window, sequences of fixed windows are used. In some embodiments, instead of using an average value inside a window, the maximum or the minimum value inside the window is used.

For a given set of parameters, a variety of values may be used. The following shows an example of how values for those parameters are selected.

Figure 8:
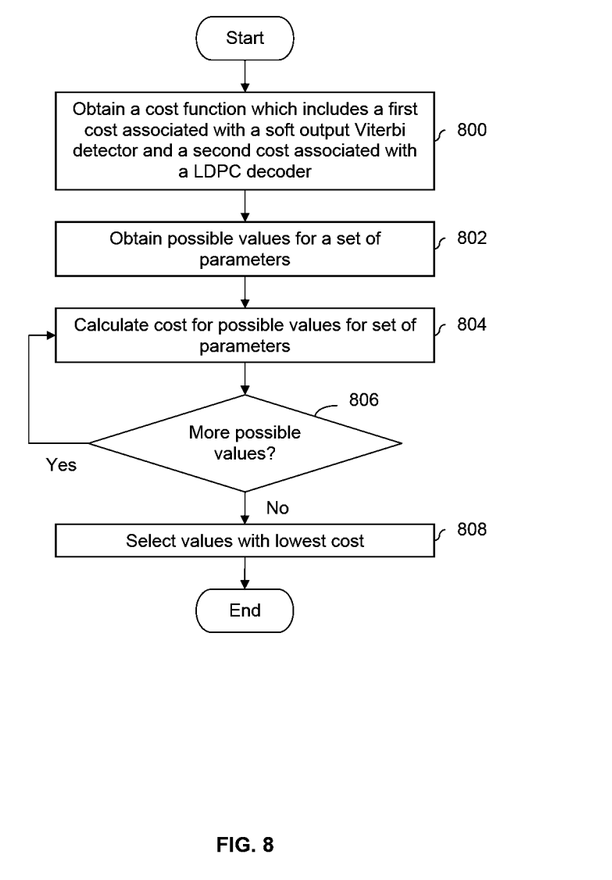
FIG. 8 is a diagram showing an embodiment of a process for selecting values for parameters associated with adaptive scheduling.

FIG. 8 is a diagram showing an embodiment of a process for selecting values for parameters associated with adaptive scheduling. For example, the value of some of the registers shown in FIG. 3 may be selected using the technique described herein.

At 800, a cost function which includes a first cost associated with a soft output Viterbi detector (or, more generally, a first processor associated with turbo equalization) and a second cost associated with a LDPC decoder (or, more generally, a second processor associated with turbo equalization) is obtained. In one example of such a cost function:

$$C = S + \alpha L \quad (6)$$

where C is the cost, S is the number of passes or iterations performed by a soft output Viterbi detector, L is the number of passes or local iterations performed by the LDPC decoder, and α is a scaling factor which takes into account the differences in resources consumed by a soft output Viterbi detector compared to an LDPC decoder (e.g., number of clocks, power consumed, delay and such consumed by each). For example, if a soft output Viterbi detector takes 3 times as many clock cycles as an LDPC decoder for one iteration, respectively, then $\alpha = \frac{1}{3}$ so that it takes 3 passes by the LDPC decoder to equal one soft output Viterbi detector. Alternatively, some scaling can be applied to S instead of L.

Possible values for a set of parameters are obtained at 802. For example, the parameters may be $s_{min}$ (a minimum number of local iterations performed by an LDPC decoder), $s_{max}$ (a maximum number of local iterations performed by an LDPC decoder), w (see, e.g., Equations (1) and (2)), and T (see, e.g., Equation (3)). For this example, a minimum as well as a maximum number of local iterations for an LDPC decoder is used; between those two extremes Equation (3) is used to decide whether to continue LDPC decoding using the metric calculated according to Equation (2). The possible values may span a relatively wide range and/or extend into relatively "unlikely" values to ensure that nothing is missed.

At 804, the cost for a (e.g., current set of) possible values for a set of parameters is obtained. For example, the same read signal can be processed using different possible values so that a comparison of costs is based on the same read signal. A simulation may be performed where a read processor (temporarily configured with the current set of values) processes a read signal in order to determine how many soft output Viterbi detector iterations (i.e., a value for S) and how many LDPC decoder iterations (i.e., a value for L) are required to properly decode the read signal. The resulting values for S and L, along with the value for a, may be used to calculate a cost for that particular set of values.

If there are more possible values at 806, a cost for a next set of possible values is calculated at 804. If there are no more possible values at 806, then the values with the lowest cost are selected at 806. For example, the table below shows costs for a variety of possible settings, where the cost is expressed as a decrease in cost compared to some baseline system. Of the four sets of possible values, the first set has the lowest cost (i.e., the largest improvement over the baseline) and those values would be used to program an adaptive scheduler in this example. Those values may then be used to program a read processor for "real world" usage.

|  | $S_{min}$ | $S_{max}$ | w | T | Cost (C) |
|---|---|---|---|---|---|
| Possible Values 1 | 2 | 8 | 18 | 10 | 13.96% better than baseline |
| Possible Values 2 | 2 | 8 | 8 | 7 | 13.74% better than baseline |
| Possible Values 3 | 2 | 8 | 12 | 8 | 12.64% better than baseline |
| Possible Values 4 | 2 | 8 | 14 | 13 | 12.17% better than baseline |

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method, comprising:
selecting a value for a window size and a value for a threshold, including by:
obtaining a cost function, wherein the cost function:
inputs a number of iterations performed by a soft output detector and a number of iterations performed by a soft output decoder; and
generates a cost by combining an input number of soft output detector iterations and an input number of soft output decoder iterations using a ratio associated with an amount of resources which would be consumed by a single soft output decoder iteration, if performed, compared to an amount of resources which would be consumed by a single soft output detector iteration, if performed;
obtaining a first possible value for the window size and a first possible value for the threshold;
determining a first number of soft output detector iterations and a first number of soft output decoder iterations to properly decode a test signal if the first possible value for the window size and the first possible value for the threshold were used;
determining a first cost using the cost function, the first number of soft output detector iterations, and the first number of soft output decoder iterations;
obtaining a second possible value for the window size and a second possible value for the threshold;
determining a second number of soft output detector iterations and a second number of soft output decoder iterations to properly decode the same test signal if the second possible value for the window size and the second possible value for the threshold were used;
determining a second cost using the cost function, the second number of soft output detector iterations, and the second number of soft output decoder iterations;
in the event the first cost is the lowest cost, selecting the first possible value for the window size and the first possible value for the threshold; and
in the event the second cost is the lowest cost, selecting the second possible value for the window size and the second possible value for the threshold;
performing decoding using the soft output detector, wherein the soft output detector includes a soft output Viterbi detector;
performing at least a portion of a local iteration of decoding using the soft output decoder, wherein the soft output decoder includes a low-density parity-check (LDPC) decoder;
generating a metric associated with decoding progress, including by determining a difference between a most recent iteration associated with the LDPC decoder and a previous iteration associated with the LDPC decoder corresponding to the selected value for the window size; and
for a next iteration, deciding between: (1) performing decoding using the soft output Viterbi detector and (2) performing decoding using the LDPC decoder based at least in part on the metric, including by comparing the metric against the selected value for the threshold.

2. The method recited in claim 1, wherein generating includes using one or more of the following over a window: a moving average, a minimum, or a maximum.

3. The method recited in claim 1, wherein generating includes generating the metric based at least in part on one or more of the following: a magnitude of a message, a number of times a sign of a message exchanged between the one or more variable nodes and the one or more check nodes has flipped, or a number of unsatisfied parity checks.

4. The method recited in claim 1, wherein determining is further based at least in part on one or more of the following: a minimum number of local iterations or a maximum number of local iterations.

5. The method recited in claim 1, wherein:
a local iteration includes a plurality of decoding steps; and
generating includes subtracting a first number of unsatisfied parity checks associated with a first decoding step from a second number of unsatisfied parity checks associated with a second decoding step.

6. The method recited in claim 1, wherein:
a local iteration includes a plurality of decoding steps; and
generating includes setting the metric to be a number of unsatisfied parity checks associated with a decoding step from the plurality of decoding steps.

7. The method recited in claim 1 further comprising performing decoding again using the soft output detector in the event it is determined to not perform another local iteration of decoding.

8. The method recited in claim 1, wherein the ratio includes a ratio between: (1) an amount of power consumed by an iteration of the soft output Viterbi detector and (2) an amount of power consumed by an iteration of the LDPC decoder.

9. The method recited in claim 1, wherein the ratio includes a ratio between: (1) an amount of time consumed by an iteration of the soft output Viterbi detector and (2) an amount of time consumed by an iteration of the LDPC decoder.

10. The method recited in claim 1, wherein the metric is further based at least in part on: (1) a number of iterations performed by the soft output Viterbi detector and (2) a number of iterations performed by the LDPC decoder.

11. A system, comprising:
a processor configured to select a value for a window size and a value for a threshold, including by:

obtaining a cost function, wherein the cost function:
  inputs a number of iterations performed by a soft output detector and a number of iterations performed by a soft output decoder; and
  generates a cost by combining an input number of soft output detector iterations and an input number of soft output decoder iterations using a ratio associated with an amount of resources which would be consumed by a single soft output decoder iteration, if performed, compared to an amount of resources which would be consumed by a single soft output detector iteration, if performed;
obtaining a first possible value for the window size and a first possible value for the threshold;
determining a first number of soft output detector iterations and a first number of soft output decoder iterations to properly decode a test signal if the first possible value for the window size and the first possible value for the threshold were used;
determining a first cost using the cost function, the first number of soft output detector iterations, and the first number of soft output decoder iterations;
obtaining a second possible value for the window size and a second possible value for the threshold;
determining a second number of soft output detector iterations and a second number of soft output decoder iterations to properly decode the same test signal if the second possible value for the window size and the second possible value for the threshold were used;
determining a second cost using the cost function, the second number of soft output detector iterations, and the second number of soft output decoder iterations;
in the event the first cost is the lowest cost, selecting the first possible value for the window size and the first possible value for the threshold; and
in the event the second cost is the lowest cost, selecting the second possible value for the window size and the second possible value for the threshold;
the soft output detector configured to perform decoding, wherein the soft output detector includes a soft output Viterbi detector;
the soft output decoder configured to perform at least a portion of a local iteration of decoding, wherein the soft output decoder includes a low-density parity-check (LDPC) decoder; and
an adaptive scheduler configured to:
  generate a metric associated with decoding progress, including by determining a difference between a most recent iteration associated with the LDPC decoder and a previous iteration associated with the LDPC decoder corresponding to the selected value for the window size; and
  for a next iteration, decide between: (1) performing decoding using the soft output Viterbi detector and (2) performing decoding using the LDPC decoder based at least in part on the metric, including by comparing the metric against the selected value for the threshold.

12. The system recited in claim 11, wherein the adaptive scheduler is configured to generate by generating the metric based at least in part on one or more of the following: a magnitude of a message, a number of times a sign of a message exchanged between the one or more variable nodes and the one or more check nodes has flipped, or a number of unsatisfied parity checks.

13. The system recited in claim 11, wherein:
a local iteration includes a plurality of decoding steps; and
the adaptive scheduler is configured to generate, including by subtracting a first number of unsatisfied parity checks associated with a first decoding step from a second number of unsatisfied parity checks associated with a second decoding step.

14. The system recited in claim 11, wherein:
a local iteration includes a plurality of decoding steps; and
the adaptive scheduler is configured to generate, including by setting the metric to be a number of unsatisfied parity checks associated with a decoding step from the plurality of decoding steps.

15. The system recited in claim 11, wherein the soft output detector is further configured to perform decoding again in the event it is determined to not perform another local iteration of decoding.

16. The system recited in claim 11, wherein the ratio includes a ratio between: (1) an amount of power consumed by an iteration of the soft output Viterbi detector and (2) an amount of power consumed by an iteration of the LDPC decoder.

17. The system recited in claim 11, wherein the ratio includes a ratio between: (1) an amount of time consumed by an iteration of the soft output Viterbi detector and (2) an amount of time consumed by an iteration of the LDPC decoder.

18. The system recited in claim 11, wherein the metric is further based at least in part on: (1) a number of iterations performed by the soft output Viterbi detector and (2) a number of iterations performed by the LDPC decoder.

19. A computer program product, the computer program product being embodied in a non-transitory computer readable storage medium and comprising computer instructions for:
selecting a value for a window size and a value for a threshold, including by:
  obtaining a cost function, wherein the cost function:
    inputs a number of iterations performed by a soft output detector and a number of iterations performed by a soft output decoder; and
    generates a cost by combining an input number of soft output detector iterations and an input number of soft output decoder iterations using a ratio associated with an amount of resources which would be consumed by a single soft output decoder iteration, if performed, compared to an amount of resources which would be consumed by a single soft output detector iteration, if performed;
  obtaining a first possible value for the window size and a first possible value for the threshold;
  determining a first number of soft output detector iterations and a first number of soft output decoder iterations to properly decode a test signal if the first possible value for the window size and the first possible value for the threshold were used;
  determining a first cost using the cost function, the first number of soft output detector iterations, and the first number of soft output decoder iterations;
  obtaining a second possible value for the window size and a second possible value for the threshold;
  determining a second number of soft output detector iterations and a second number of soft output decoder iterations to properly decode the same test signal if the second possible value for the window size and the second possible value for the threshold were used;
  determining a second cost using the cost function, the second number of soft output detector iterations, and the second number of soft output decoder iterations;

in the event the first cost is the lowest cost, selecting the first possible value for the window size and the first possible value for the threshold; and in the event the second cost is the lowest cost, selecting the second possible value for the window size and the second possible value for the threshold;

performing decoding using the soft output detector, wherein the soft output detector includes a soft output Viterbi detector;

performing at least a portion of a local iteration of decoding using the soft output decoder, wherein the soft output decoder includes a low-density parity-check (LDPC) decoder;

generating a metric associated with decoding progress, including by determining a difference between a most recent iteration associated with the LDPC decoder and a previous iteration associated with the LDPC decoder corresponding to the selected value for the window size; and for a next iteration, deciding between: (1) performing decoding using the soft output Viterbi detector and (2) performing decoding using the LDPC decoder based at least in part on the metric, including by comparing the metric against the selected value for the threshold.

20. The computer program product recited in claim 19, wherein the ratio includes a ratio between: (1) an amount of power consumed by an iteration of the soft output Viterbi detector and (2) an amount of power consumed by an iteration of the LDPC decoder.

21. The computer program product recited in claim 19, wherein the ratio includes a ratio between: (1) an amount of time consumed by an iteration of the soft output Viterbi detector and (2) an amount of time consumed by an iteration of the LDPC decoder.

22. The computer program product recited in claim 19, wherein the metric is further based at least in part on: (1) a number of iterations performed by the soft output Viterbi detector and (2) a number of iterations performed by the LDPC decoder.

23. The computer program product recited in claim 19, wherein the computer instructions for generating include computer instructions for generating the metric based at least in part on one or more of the following: a magnitude of a message, a number of times a sign of a message exchanged between the one or more variable nodes and the one or more check nodes has flipped, or a number of unsatisfied parity checks.

* * * * *